United States Patent [19]

Fukatsu et al.

[11] Patent Number: 4,937,095
[45] Date of Patent: Jun. 26, 1990

[54] METHOD FOR FORMING A FILM

[75] Inventors: Takeo Fukatsu, Uji; Yasuo Kishi, Hirakata, both of Japan

[73] Assignee: Sanyo Electric Co., Ltd., Moriguchi, Japan

[21] Appl. No.: 358,561

[22] Filed: May 30, 1989

Related U.S. Application Data

[62] Division of Ser. No. 180,044, Apr. 11, 1988, abandoned.

[30] Foreign Application Priority Data

Apr. 20, 1987 [JP] Japan .................................. 62-96464

[51] Int. Cl.$^5$ .............................................. B05D 3/06
[52] U.S. Cl. .................................. 427/39; 427/255.5; 427/294; 427/299
[58] Field of Search ................. 427/39, 255.5, 294, 427/299

[56] References Cited

U.S. PATENT DOCUMENTS 4,438,723 3/1984 Cannella et al. .................... 118/718
4,501,766 2/1985 Suzuki et al. .......................... 427/38

Primary Examiner—Bernard Pianalto
Attorney, Agent, or Firm—W. G. Fasse; D. H. Kane, Jr.

[57] ABSTRACT

A method for forming a film is carried out by a film forming apparatus in which two cylindrical discharge electrodes are arranged opposite to each other at an inner wall and at an outer wall of an annular reaction chamber. A plurality of cylindrical substrates on which film is to be formed are arranged along the circumference in the region surrounded by the discharge electrodes. The substrate revolves about its own axis and additionally the substrate rotates with a platform. An electric power of 200 W is applied to the discharge electrode of the inner wall by an electric power supply having a frequency of 231 KHz, for example. An electric power of 600 W is applied to the discharge electrode at the outer wall by an electric power supply having a frequency of 400 KHz, for example. A reaction gas mainly in the form of SiH$_4$ gas is introduced into the reaction chamber and the pressure in the reaction chamber is held at about 0.5 to 2.0 Torr. In this manner, the reaction gas is decomposed and an amorphous silicon film is formed on the outer cylindrical surface of the cylindrical substrates.

13 Claims, 5 Drawing Sheets

METHOD FOR FORMING A FILM

This is a divisional of application Ser. No. 180,044 filed Apr. 11, 1988, now abandoned.

FIELD OF THE INVENTION

The present invention relates to a method and apparatus for forming a film and, more specifically, it relates to a method and apparatus suitable for forming an amorphous semiconductor film employed in semiconductor devices such as a solar battery, an electrophotographic photoreceptor, and the like.

BACKGROUND INFORMATION

Generally, a technology of decomposing a raw material gas by a glow discharge for forming a desired amorphous semiconductor film on a substrate, is used for forming an amorphous silicon film for a solar battery or an electrophotographic photoreceptor.

In manufacturing a solar battery, an electric power of high frequency is supplied to one parallel plate electrode of a pair of electrodes to cause a glow discharge between electrodes, whereby the other parallel plate electrode is grounded. Thus, an amorphous silicon film is formed on the surface of the substrate which is placed on the other parallel plate electrode. The method for forming a film on a substrate employing parallel plate electrodes is disclosed in, for example, U.S. Pat. No. 4,438,723, wherein a plurality of discharge electrodes are employed for causing a glow discharge. The electric power having the same frequency is separately supplied from a plurality of power supplies to each of the discharge electrodes. Although each power supply is assumed to have the same frequency, actually the frequencies applied to the discharge electrodes differ very slightly from each other. Therefore, the electromagnetic waves of high frequency from all discharge electrodes interfere with each other, causing a beat, a fluctuation, and so on. As a result, the discharge generated in the chamber becomes uneven. This presents a disadvantage in manufacturing because optimal conditions for forming an even film on the substrate can hardly be maintained.

A method for forming a film on an outer cylindrical wall surface of a cylindrical substrate, for example a method for forming an electrophotographic photoreceptor, is disclosed in, for example, U.S. Pat. No. 4,501,766, wherein a plurality of discharge electrodes are arranged opposite to each other to surround a plurality of substrates. The electric power of the same frequency is branched from a single power supply and applied to each of the plurality of the discharge electrodes. However, since the electric power of high frequency is supplied from a single power supply in such structure, the electric power of high frequency applied to each electrode cannot be separately controlled. Therefore, it is difficult to set the optimal conditions for forming a film of a uniform thickness. In addition, if the area of each discharge electrode differs from each other in the known structure, for example, if two cylindrical discharge electrodes comprising an inner wall and an outer wall are used, the power density of each electrode becomes uneven. In that case, it is difficult to adjust the state of each electrode to the same condition.

Therefore, it is difficult to make films having uniform characteristics so long as the film is formed by employing apparatuses of the above described conventional structures. For example, in manufacturing an electrophotographic photoreceptor, defects such as pin holes are generated in the film, so that the quality of the image cannot be enhanced In manufacturing a solar battery, the conversion efficiency cannot be enhanced.

Japanese Patent Publication Gazette No. 30130/1984 discloses a method for forming a film on a substrate by applying a plurality of different frequencies superimposed on each other to a single discharge electrode to cause a discharge.

SUMMARY OF THE INVENTION

An object of the present invention is to provide a method and apparatus for forming a film in which the discharge generated in the film forming reaction chamber can be maintained at a stable state, in other words, under stable operating conditions.

Another object of the present invention is to provide a method and apparatus for forming a film in which the electric power applied to each discharge electrode can be independently and arbitrarily controlled, so that optimal operating conditions can be easily set and maintained.

A further object of the present invention is to provide a method and apparatus for forming a film, which apparatus is capable of enhancing the characteristics of the film obtained by practicing the present method in the present apparatus.

According to the method and apparatus for forming a film of the present invention, a plurality of discharge electrodes are arranged in a film forming reaction chamber and a substrate is arranged so that at least the main surface thereof is opposed to the discharge electrodes which differ from each other in the size of the electrode area. Electric power from different electric power sources having different frequencies, is applied to the respective discharge electrode. A gas comprising the raw material of which the respective film is to be made, is introduced into the film forming reaction chamber. A prescribed internal gas pressure is adjusted in the reaction chamber. The electric power is applied between each of the discharge electrodes and the corresponding substrate, whereby a discharge is generated in the film forming reaction chamber and the raw material gas is decomposed. In this manner, a film is formed on the main surface of the substrate.

Preferably, the discharge in the film forming reaction chamber is a glow discharge. The difference between the frequencies of the two power supplies should be in the range of 1MHz to 100GHz, 1Khz to 1MHz, or 10Hz to 1KHz.

The film forming reaction chamber may comprise a plurality of film forming chamber sections and one film forming chamber section may be provided for each of the discharge electrodes. In that case, different raw material gases for different films may be introduced into each of the film forming chamber sections.

The several discharge electrodes may be arranged opposite to each other. The combination of discharge electrodes having different areas and a flat or curved shape with different power supply frequencies improves the controllability. By arranging discharge electrodes having a curved shape and different areas opposite to each other and by employing a rotary substrate, the film may be formed with the substrate being rotated.

In the method and apparatus for forming a film in accordance with the present invention, a plurality of discharge electrodes are arranged in the film forming reaction chamber and a different frequency electric power is supplied to each discharge electrode. Therefore, the beat, fluctuation and the like caused by the interference between the electromagnetic waves of high frequencies from each of the discharge electrodes can be suppressed. As a result, the discharge generated in the film forming reaction chamber can be made even or rather uniform and it can be maintained at a stable state. The electric power to each discharge electrode can be separately and independently controlled. Therefore, the condition for forming a film can be made optimal corresponding to the characteristics of the film to be obtained.

In the present invention, by setting the above mentioned frequency difference in the range of 1MHz to 100GHz, a preferable film forming rate and improved film characteristic have been obtained. By setting the above mentioned frequency difference in the range of 1KHz to 1MHz, the dust generated in the process of film forming can be suppressed and an improved film forming rate and improved film characteristics have been obtained. The same applies when the above mentioned frequency difference is in the range of 10Hz to 1Khz.

Furthermore, by arranging a plurality of discharge electrodes separately in a plurality of film forming reaction chamber sections, the conditions for forming a film can be made optimal in every film forming chamber. In this case, by introducing different raw material gases for different films into each film forming chamber, a plurality of films of different materials can be formed and successively stacked on the main surface of a substrate.

In addition, in this invention, by arranging a plurality of discharge electrodes such that they are opposed to each other with the substrate interposed therebetween, a film can be formed on the entire outer cylindrical surface of the substrate. In this case, by employing discharge electrodes having a curved shape and different areas, a film can be formed advantageously on the entire outer cylindrical surface of the substrate. Furthermore, by employing a substrate of a rotary shape, a film can be formed on the outer surface of the substrate while the substrate is being rotated.

These objects and other objects, features, aspects and advantages of the present invention will become more apparent from the following detailed description of the present invention when taken in conjunction with the accompanying drawings.

DESCRIPTION OF PREFERRED EMBODIMENTS AND OF THE BEST MODE OF THE INVENTION

Figure 1:
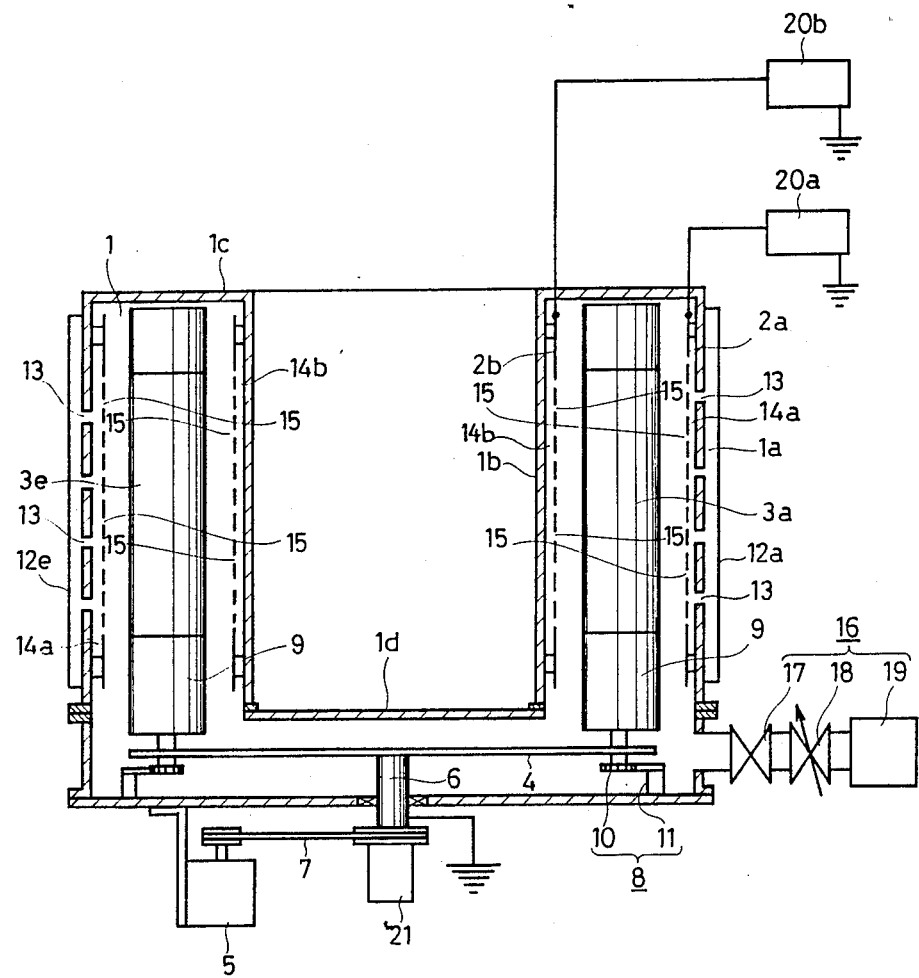
FIG. 1 is a schematic diagram showing a partial and vertical section through a plasma CVD apparatus wherein the method for forming a film of the present invention is performed.
Figure 2:
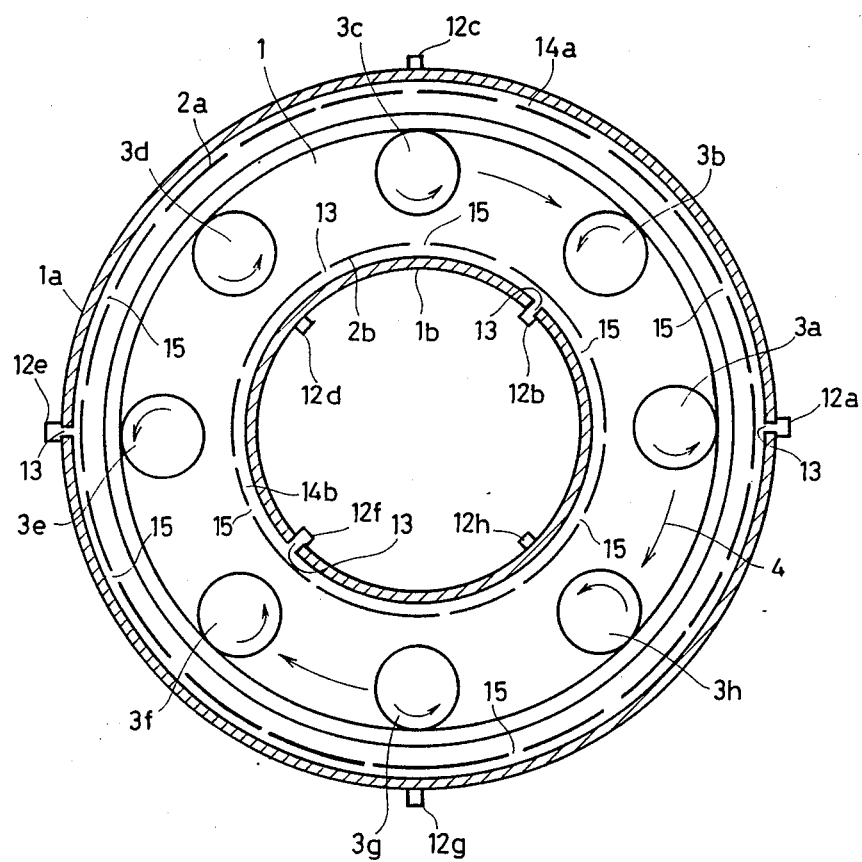
FIG. 2 is a transverse sectional view through the apparatus of FIG. 1.

Referring to FIGS. 1 and 2, the reaction chamber 1 is sealed so that the pressure thereof can be reduced, with the vertical section being U-shaped and the transverse section being annular.

A first stationary discharge electrode 2a and a second stationary discharge electrode 2b are concentrically and cylindrically arranged opposed to each other along the outer wall 1a or the inner wall 1b which forms the annular portion of the reaction chamber 1. As shown in FIG. 2, the cylindrical discharge electrodes 2a and 2b have different diameters and hence different surface area sizes. The outer wall 1a and the inner wall 1b may be used as the first discharge electrode 2a and the second discharge electrode 2b, respectively, by electrically insulating the outer wall 1a and the inner wall 1b from the upper wall 1c and the bottom wall 1d. The region or space between the first stationary discharge electrode 2a and the second stationary discharge electrode 2b, that is, the annular ring space, is provided with eight cylindrical substrates 3a to 3h. A turntable 4 is provided revolve the cylindrical substrates 3a to 3h along the annular portion. A motor 5 is provided to apply driving force to the shaft 6 of the turntable 4 through a belt 7. A rotation mechanism 8 rotates each of the cylindrical substrates 3a to 3h around its respective longitudinal axis, whereby the substrates simultaneously revolve about the rotational axis of the shaft 6. The rotation mechanism 8 comprises a spur gear 10 for each substrate and a fixed inner gear ring 11 meshing with all spur gears 10. Each spur gear 10 has a small diameter and is rigidly secured to a shaft portion of a respective substrate holding member 9. Each holding member 9 holds its respective substrate 3a to 3h so that its central axis extends vertically and perpendicularly to the turntable 4. Each holding member shaft portion is mounted by a bearing in the turntable 4 for rotation relative to the turntable 4 and for rotation with the turntable 4. The fixed inner gear ring 11, which meshes with all spur gears 10, has an inner diameter slightly smaller than the outer diameter of the turntable 4 to assure said meshing. Thus, when the turntable 4 rotates, the substrates 3a to 3h revolve about the rotational axis of the shaft 6 of the turntable 4 and simultaneously each substrate 3a to 3h rotates about its own longitudinal axis by the meshing of the spur gears 10 with the fixed inner ring gear 11 which is mounted on a support 11'.

Reaction gas introducing ducts 12a to 12h are alternately arranged outside the outer wall 1a or the inner wall 1b so as to introduce the reaction gas into the reaction chamber 1 from a gas source. In order to form a film consisting of amorphous silicon, polycrystalline silicon or single crystal silicon, silan ($SiH_4$), disilan ($Si_2H_6$), or silicontetrafluoride ($SiF_4$) is used as the reaction gas. In order to form a film of $SiO_2$, a mixed gas comprising oxygen ($O_2$) and silan, disilan or silicontetrafluoride is used as the reaction gas. In order to form a film of $Si_3N_4$, a mixed gas comprising silan, disilan, or silicontetrafluoride and nitride $N_2$ or ammonia ($NH_3$) is used. In order to form a film of SiC, a mixed gas comprising methane ($CH_4$) and silan, disilan or silicontetrafluoride is used. In order to form a film of amorphous SiGe, a mixed gas comprising silan, disilan or silicontetrafluoride and germanium hydride ($GeH_4$) is used. Germanium hydride is used as the reaction gas in order to form a film of amorphous germanium, polycrystalline germanium or single crystal germanium. In order to form a film of amorphous carbon, graphite or diamond, methane gas or acetylene gas is used.

An introduction hole 13 is provided in the outer wall 1a or the inner wall 1b in order to communicate the reaction gas introducing ducts 12a to 12h with the reaction chamber 1 to introduce the reaction gas into the reaction chamber 1. Trap chambers 14a and 14b are provided for temporarily trapping the reaction gas introduced through the hole 13. By this structure, the reaction gas is uniformly supplied into the reaction chamber 1 passing from the trap chambers 14a and 14b through a number of discharge holes 15 provided in the first discharge electrode 2a and the second discharge electrode 2b.

The evacuating system 16 is provided to evacuate and reduce pressure in the reaction chamber 1 to less than about $10^{-3}$Torr. The evacuating system 16 comprises a main valve 17, a pressure adjustment valve 18, and a vacuum pump 19 such as a rotary pump, or a diffusion pump, or a molecular pump, or the like. The reaction chamber 1 is once evacuated to high vacuum by the evacuating system 16 and, thereafter, the reaction gas is introduced as described above and the pressure of the reaction gas is held at about 0.5 to 2.0 Torr.

A first electric power supply 20a supplies electric power with the above mentioned first frequency to the first discharge electrode 2a, while a second electric power supply 20b supplies electric power with the second frequency, which differs from the first frequency, to the second discharge electrode 2b. When electric power of high frequency is applied to each discharge electrode from each of these electric power supplies under the reduced pressure condition, a glow discharge is generated between the first discharge electrode 2a or the second discharge electrode 2b and each of the substrates 3a to 3h to form a plasma. A slip electrode 21 is electrically insulated from the drive shaft 6 of the turntable 4, for electrically energizing a heater (not shown) for internally heating the substrates 3a to 3h to a temperature of about 100° to 300° C.

A method for manufacturing an amorphous silicon system semiconductor film used as a photoconductive layer in a photoreceptor of an electrophotographic copying machine, an LED printer, a laser printer, or the like employing the above described plasma CVD apparatus will now be described in more detail.

First, eight cylindrical substrates 3a to 3h formed of aluminum and having the outer cylindrical surfaces finely finished are mounted on the respective holding members 9 which are mounted in bearings on the turntable 4 spaced apart from each other by 45°. After the substrates 3a to 3h are mounted, the reaction chamber 1 is closed air-tightly and evacuated to about $1 \times 10^{-6}$ Torr by the operation of the vacuum pump 19. Thereafter, by means of the heaters contained in the substrates 3a to 3h, the substrates 3a to 3h are heated to a prescribed temperature in the range of 100° to 300° C., for example, about 250° C.

The reaction gas is introduced through the reaction gas introducing ducts 12a to 12h into the trap chambers 14a and 14b. In this case, silan (SiH$_4$) gas, hydrogen (H$_2$) gas, diborane (B$_2$H$_6$) gas, and oxygen (O$_2$) gas are introduced as the reaction gas with their flow rates controlled to be 200cc/min., 10cc/min., $500 \times 10^{-6}$cc/min. and 10cc/min., respectively. The pressure in the reaction chamber 1 is maintained at about 0.5 to 2 Torr.

In this manner, the reaction gas mainly comprising silan (SiH$_4$) gas is temporarily trapped in the trap chambers 14a and 14b and thereafter it is uniformly supplied into the reaction chamber 1 through a number of discharge holes 15 provided in the first discharge electrode 2a and the second discharge electrode 2b. Simultaneously, high frequency electric power is supplied between the first discharge electrode 2a and the substrates 3a to 3h by the first electric power supply 20a having a frequency of, for example, 13.56MHz. The high frequency electric power is supplied between the second discharge electrode 2b and the substrates 3a tp 3h by the second electric power supply 20b having a frequency of, for example, 400KHz. The high frequency electric power to be supplied is respectively about 20W to 2KW. The application of the high frequency electric power generates a plasma decomposing the reaction gas introduced into the reaction chamber 1. On this occasion, each of the substrates 3a to 3h revolves about the rotational axis of the shaft 6 at the speed of, for example, 0.1 to 10 rpm. along with the turntable 4 by the actuation of the motor 5. Each of the substrates 3a to 3h rotates at the speed of, for example, about 20 rpm. about its own longitudinal axis by the operation of the rotation mechanism 8.

In this manner the decomposition of the reaction gas is continuously carried out for 1 to 8 hours by the plasma caused between the first discharge electrode 2a or the second discharge electrode 2b and each of the substrates 3a to 3h while each of the substrates 3a to 3h revolves and rotates. By doing so, a film of amorphous silicon hydride having the thickness of about 1 to 80µm is formed on the outer cylindrical surface of each of the substrates 3a to 3h.

In accordance with the present manufacturing method described above, amorphous silicon films are formed by changing the wattage and the frequency of the electric power supplied to each discharge electrode as shown in the following table. For the purpose of comparison, Case No. 1 represents the prior art in which an amorphous silicon film is formed by supplying electric power of the same frequency branched from a single electric power supply source to each discharge electrode. In the table, the film formation under the condition of Case No. 4 is carried out by introducing microwave energy (2.45GHz) to a part of the first discharge electrode arranged along the outer wall.

TABLE

| Case No. | Type of Electric Power Supply | First Discharge Electrode frequency | power (W) | Second Discharge Electrode frequency | power (W) | Difference of Frequency |
|---|---|---|---|---|---|---|
| 1 | branched from single power supply | 13.56 MHz | 600 | 13.56 MHz | 600 | — |
| 2 | independent | 13.56 MHz | 500 | 400 KHz | 200 | 13.16 MHz |
| 3 | two power | 400 KHz | 500 | 13.56 MHz | 200 | 13.16 MHz |

TABLE-continued

| Case No. | Type of Electric Power Supply | First Discharge Electrode | | Second Discharge Electrode | | Difference of Frequency |
|---|---|---|---|---|---|---|
| | | frequency | power (W) | frequency | power (W) | |
| 4 | supplies | 2.45 GHz | 400 | 13.56 MHz | 300 | 2.43644 GHz |
| 5 | | 500 KHz | 600 | 510 KHz | 200 | 10 KHz |
| 6 | | 400 KHz | 600 | 231 KHz | 200 | 169 KHz |
| 7 | | 110 KHz | 600 | 800 KHz | 100 | 690 KHz |
| 8 | | 60 Hz | 700 | 0(DC) | 100 | 60 Hz |
| 9 | | 60 Hz | 700 | 1 KHz | 200 | 940 Hz |

As for the Cases No. 2, 3 and 4 in which the difference frequency is in the range of 1MHz to 100GHz, the quality of the film evaluated by the rate of film formation and the quality of the image of the photoreceptor, is superior to the quality of the film formed under the conditions of Case No. 1. As for the Cases No. 5, 6 and 7 in which the difference frequency is in the range of 1KHz to 1 MHz, the amount of dust generated in the film forming process, is smaller than that in Case No. 1 of the prior art and the quality of the film evaluated by the rate of film formation and the quality of the image of the photoreceptor is also superior. As for the Cases No. 8 and 9 in which the difference frequency is in the range of 10Hz to 1KHz, the rate of film formation is almost the same as in the prior art; however, the amount of dust generated is smaller and the quality of the film is superior to that of the prior art Case No. 1.

In view of the foregoing, it is understood that the difference of frequency is preferably in the range of 1KHz to 1MHz.

As is apparent from the above description, since the first and the second electric power supplies 20a and 20b for supplying electric power to each of the discharge electrodes 2a and 2b, supply power with different frequencies, the beat, fluctuation and so on caused by the interference of an electromagnetic wave of high frequency can be suppressed, thereby maintaining the glow discharge at a stable state. The application of electric power to the first discharge electrode 2a and to the second discharge electrode 2b having different areas can be independently and separately controlled, so that the state of these electrodes can be maintained at the optimal state.

Figure 3:
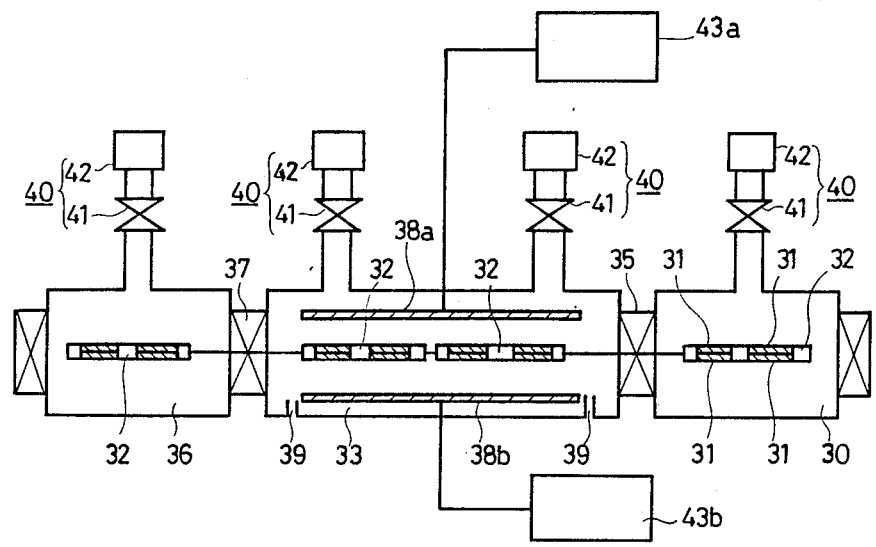
FIG. 3 is a schematic diagram showing another embodiment of a plasma CVD apparatus for performing the method for forming a film of the present invention.

FIG. 3 is a schematic diagram showing another plasma CVD apparatus for forming a solar battery or photo-sensor employing the method for forming a film in accordance with the present invention, whereby a partially transverse section of the apparatus is shown.

A tray 32 for holding and moving a substrate 31 on both side surfaces of the tray 32 is in the standby state in the standby chamber 30 wherein the pressure is reduced. A reaction chamber 33, wherein the pressure can be reduced by evacuating means 40, is provided to accommodate the tray 32 which is conveyed from the standby chamber 30 through a shutter 35. A receiving chamber 36, wherein the pressure can be maintained at the reduced state, is provided to receive the tray 32 which is conveyed from the chamber 33 through a shutter 37. A first plate electrode 38a and a second plate electrode 38b are arranged opposite to each other at both sides of the reaction chamber 33. A reaction gas introducing duct 39 for introducing the reaction gas into the reaction chamber 33 is provided in the side wall of the reaction chamber 33. In order to evacuate the standby chamber 30, the reaction chamber 33, and the receiving chamber 36 to a high vacuum less than about $10^{-3}$ Torr, the evacuating means 40 are provided for each of these chambers. Each evacuating means 40 comprises a valve 41 and a vacuum pump 42. The reaction chamber 33 is once evacuated to a high vacuum and thereafter the pressure therein is held at about 1 Torr by the reaction gas introduced through the reaction gas introducing duct 39.

A first electric power supply 43a is connected to apply an electric power having a frequency of, for example, 200KHz to the first plate electrode 38a, and a second electric power supply 43b is connected to apply an electric power having a frequency of, for example, 13.56MHz to the second plate electrode 38b.

Employing the plasma CVD apparatus having the above described structure, the tray 32 has been moved into the reaction chamber 33 and the pressure of the reaction gas in the reaction chamber 33 is maintained at the prescribed pressure. In this state, electric power having a frequency of, for example, 200KHz is applied to the first plate electrode 38a by the first electric power supply 43a and an electric power having a frequency of, for example, 13.56MHz is applied to the second plate electrode 38b by the second high frequency power supply 43b. Consequently, a film of an amorphous semiconductor is formed on the surface of the substrate 31 held by the tray 32 corresponding to the type of the reaction gas introduced into the reaction chamber 31.

Figure 4:
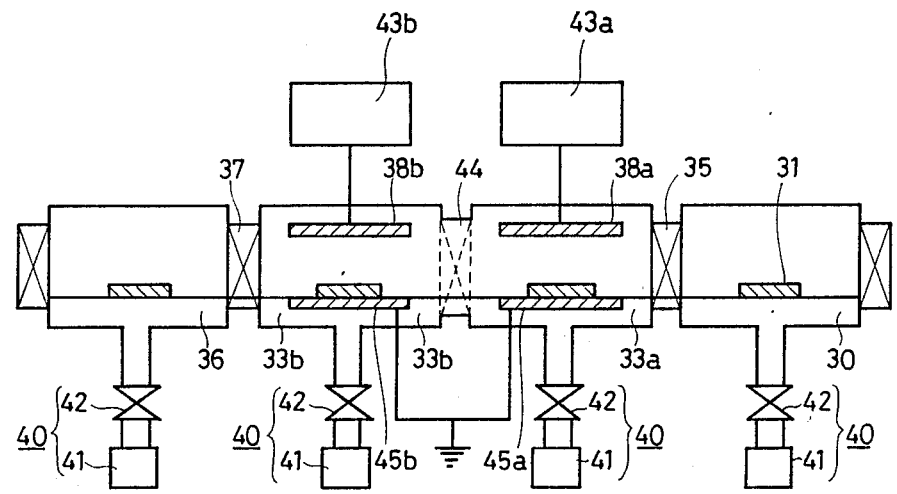
FIG. 4 is a schematic diagram showing a further embodiment of a plasma CVD apparatus for performing the method for forming a film of the present invention.

FIG. 4 is a schematic diagram showing a plasma CVD apparatus for forming two layers of films of different materials stacked on each other on a substrate.

A first plate electrode 38a is arranged in a first reaction chamber 33a and a second discharge electrode 38b is arranged in the second reaction chamber 33b. An air curtain 44 is formed between the first reaction chamber 33a and the second reaction chamber 33b. A substrate 31 is shown on the substrate electrodes 45a and 45b in the first and second reaction chambers 33a and 33b. Both substrate electrodes 45a and 45b are grounded. Other structures are the same as in the apparatus shown in FIG. 3, so that the description thereof is omitted.

In operation, the substrate 31 is moved from the standby chamber 33 through the first reaction chamber 33a through the second reaction chamber 33b into the receiving chamber 36. In the first reaction chamber 33a, a mixed gas comprising $SiH_4$, $B_2H_6$ and $H_2$ maintained at a prescribed pressure, is supplied as the reaction gas. In the second reaction chamber 33b, the mixed gas comprising $SiH_4$, $PH_3$ and $H_2$ maintained at a prescribed pressure is supplied as the reaction gas. An electric power having a frequency of 490KHz is supplied by the first electric power supply 43a to the first plate electrode 38a with 200W, while the electric power having a frequency of 400KHz is supplied by the second electric power supply 43b to the second plate electrode 38b with 400W.

By using this apparatus, first, a first amorphous silicon film comprising boron as a P-type impurity is formed on the surface of the substrate 31 by the reaction gas dissolved by the glow discharge generated in the first reaction chamber 33a. Thereafter, the substrate 31 is moved into the second reaction chamber 33b where a second amorphous silicon film comprising phosphorus as an N-type impurity is formed on the first amorphous silicon film by the reaction gas dissolved by the glow discharge.

In this manner, by arranging a plurality of discharge electrodes in separate reaction chambers, films of different materials can be successively formed on the same substrate. The reaction gas can be independently and separately supplied into each reaction chamber corresponding to the kind of film to be formed and, in addition, the conditions for forming the film can be independently and optimally adjusted in each chamber.

Figure 5:
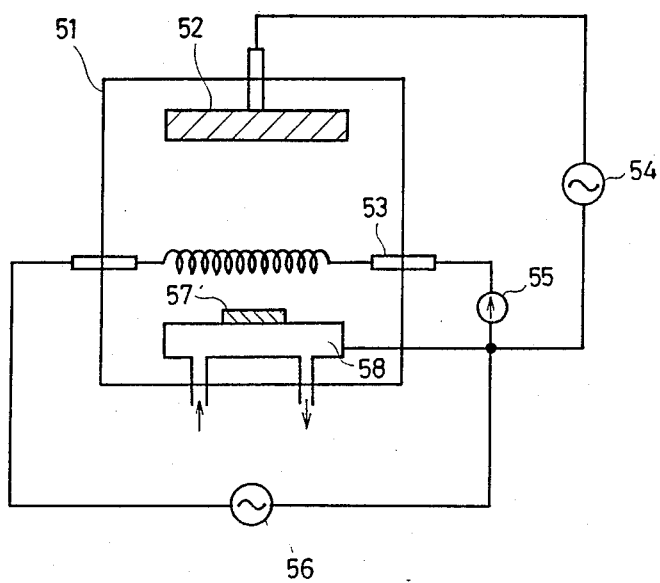
FIG. 5 is a schematic diagram showing one embodiment of a film forming apparatus utilizing an arc discharge in accordance with the method for forming a film of the present invention.

FIG. 5 is a schematic diagram showing a film forming apparatus for forming a film of amorphous carbon, diamond or the like on substrate formed of polycrystalline silicon, graphite, $Al_2O_3$ or the like.

In FIG. 5, a first discharge electrode 52 and a second discharge electrode 53 are provided in a vacuum chamber 51. Electric power having a frequency of, for example, 400 KHz, 13.56MHz or 2.5GHz (microwave) is supplied by an electric power supply 54 to the first discharge electrode 52. The second discharge electrode 53 has a tungsten filament forming a tungsten electrode. An AC power source 56 is connected to the second discharge electrode 53 for heating the filament of the electrode 53. A DC discharge is generated between the second discharge electrode 53 and a substrate electrode 58 by a DC power source 55 connected to the second discharge electrode 53. A substrate 57 on the substrate electrode 58 faces the first discharge electrode 52 and the second discharge electrode 53. The substrate electrode 58 is constantly cooled by cooling water flowing in the direction of the arrows. Between the first discharge electrode 52 and the substrate electrode 58 an arc discharge or glow discharge is generated by the application of the electric power of high frequency from the electric power supply 54. Between the second discharge electrode 53 and the substrate electrode 58, thermal electrons are discharged from the filament of the second discharge electrode 53 by the application of the 100 DC power causing an arc discharge. When a mixed gas comprising $CH_4$, Ar, $H_2$ and $O_2$ is introduced as the reaction gas with prescribed pressure into the vacuum chamber 51, the reaction gas is decomposed by the arc discharge, whereby a film of amorphous carbon, diamond or the like is formed on the substrate 57.

In this manner a film can be formed on the substrate by arranging a plurality of discharge electrodes and generating not only a glow discharge but also an arc discharge. The discharge generated by each discharge electrode can be optimally adjusted as required by the type of the film to be formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for forming a film having a desired thickness on a surface of a substrate, comprising the following steps:

(a) enclosing at least a first stationary discharge electrode and a second stationary discharge electrode in a film forming chamber to form a space between said first and second stationary discharge electrodes,
    (b) rotatably supporting at least one substrate in said space between said first and second stationary discharge electrodes so that the substrate faces said discharge electrodes,
    (c) applying a first electric power having a first frequency between said substrate and said first stationary discharge electrode,
    (d) applying a second electric power having a second frequency different from said first frequency between said substrate and said second stationary discharge electrode,
    (e) introducing a raw material gas into said space for forming said film,
    (f) adjusting a prescribed inner pressure in said space, and
    (g) rotating said substrate and generating a discharge in said space between said substrate and said first stationary discharge electrodes and between said substrate and said second stationary discharge electrode, whereby each stationary discharge electrode is operated at a different frequency for decomposing said raw material gas, and whereby only said substrate needs to be rotated.

2. The method of claim 1, further comprising generating a glow discharge between said substrate and said first and second stationary discharge electrodes respectively.

3. The method of claim 1, further comprising maintaining a frequency difference between said first and second frequencies in the range of 1 MHz to 100 GHz.

4. The method of claim 1, further comprising maintaining a frequency difference between said first and second frequencies in the range of 1 KHz to 1MHz.

5. The method of claim 1, further comprising maintaining a frequency difference between said first and second frequencies in the range of 10Hz to 1KHz.

6. The method of claim 1, further comprising arranging said first and second stationary discharge electrodes concentrically to each other to form said space as a ring space.

7. The method of claim 6, comprising rotating said substrate concentrically between said first and second stationary discharge electrodes.

8. The method of claim 1, comprising rotatably arranging a plurality of substrates on a turntable, rotating said plurality of substrates together with said turntable, and additionally rotating each substrate individually on said turntable.

9. A method for forming a film having a desired thickness on a surface of a substrate, comprising the following steps:

(a) arranging at least a first cylindrical discharge electrode and a second cylindrical discharge electrode in stationary positions in a film forming chamber, each of said first and second stationary cylindrical discharge electrodes having a different diameter and thus different surface area sizes;
    (b) rotatably supporting a plurality of cylindrical substrates in said film forming chamber in a ring space between said first and second stationary cylindrical discharge electrodes so that at least a main substrate surface is opposed to said cylindrical discharge electrodes;

(c) supplying first and second electric powers having different frequencies respectively between said substrate and said first and second stationary cylindrical discharge electrodes respectively;

(d) introducing a gas comprising raw material for forming said film, into said film forming chamber and adjusting a prescribed inner gas pressure in said chamber; and (e) generating a discharge while rotating said substrate in said film forming chamber to decompose said gas, whereby a film is formed on the main surface of said substrate.

10. A method for forming a film having a desired thickness on a surface of a substrate, comprising the following steps:

providing a film forming chamber having first and second film forming chamber sections;

arranging at least a first discharge electrode in said first film forming chamber section and arranging a second discharge electrode in said second film forming chamber section;

arranging substrate elements in said film forming chamber sections such that at least a main surface of said substrate is opposed to at least one of said discharge electrodes;

supplying first and second electric powers having different frequencies respectively, to said first and second discharge electrodes; introducing a gas comprising raw material for forming said film into said film forming chamber sections and pressurizing said film forming chamber sections to a prescribed pressure; and generating a discharge in said film forming chamber sections by applying said electric power between said first and second discharge electrodes and said substrate for decomposing said gas, whereby a film is formed on the main surface of said substrate elements.

11. The method of claim 10, wherein said step of introducing said gas comprises introducing a first gas comprising a first raw material for forming a first film in said first film forming chamber section, and introducing a second gas comprising a second raw material for forming a second film in said second film forming chamber section, whereby a first film and a second film are formed on the main surface of said substrate elements.

12. A method for forming a film having a desired thickness on a surface of a substrate, comprising the following steps of:

arranging at least a first discharge electrode and a second discharge electrode in a film forming chamber;

arranging a substrate in said film forming chamber such that at least a main surface of said substrate is opposed to at least one of said discharge electrodes;

supply first and second electric powers having different frequencies respectively, to said first and second discharge electrodes;

introducing a gas comprising raw material for forming said film into said film forming chamber and pressurizing said film forming chamber to a prescribed pressure; and generating an arc discharge in said film forming chamber by applying said electric power between said first and second discharge electrodes and said substrate to decompose said gas, whereby a film is formed on the main surface of said substrate.

13. The method of claim 12, wherein said arc discharge is generated by applying a DC power between said substrate and at least one of said first and second discharge electrodes.

* * * * *